(12) United States Patent
Olsen (10) Patent No.: US 6,291,909 B1
(45) Date of Patent: Sep. 18, 2001

(54) SOLID STATE RELAY (75) Inventor: Michael P. Olsen, Minneapolis, MN (US)

(73) Assignee: HLO, L.L.P., Eden Prairie, MN (US)

( * ) Notice: Subject to any disclaimer, the term of this patent is extended or adjusted under 35 U.S.C. 154(b) by 0 days.

(21) Appl. No.: 09/448,012

(22) Filed: Nov. 23, 1999

Related U.S. Application Data (63) Continuation-in-part of application No. 09/303,149, filed on Apr. 30, 1999, now abandoned.

(51) Int. Cl.[7] .................................................. H01H 47/00
(52) U.S. Cl. ........................ 307/125; 315/291; 315/307; 327/446
(58) Field of Search ............................. 307/125; 327/446, 327/452, 455; 315/291, 307, 308, 312

(56) References Cited

U.S. PATENT DOCUMENTS

| | | | |
|---|---|---|---|
| 3,932,770 | 1/1976 | Fantozzi | 307/252 UA |
| 4,510,549 * | 4/1985 | Tedesco | 361/86 |
| 4,521,693 | 6/1985 | Johnson | 307/252 T |
| 4,896,828 | 1/1990 | Peitz, Jr. | 236/10 |
| 5,140,255 | 8/1992 | Tardio et al. | 323/322 |
| 5,327,123 | 7/1994 | Heimann et al. | 340/916 |
| 5,387,908 * | 2/1995 | Henry et al. | 340/916 |
| 5,659,305 | 8/1997 | Rains et al. | 340/931 |
| 5,699,218 | 12/1997 | Kadah | 361/13 |
| 5,734,116 | 3/1998 | Schaeffer | 73/865.6 |
| 6,013,988 * | 1/2000 | Bucks et al. | 315/291 |
| 6,051,935 * | 4/2000 | Bucks et al. | 315/307 |
| 6,091,166 * | 7/2000 | Olsen et al. | 307/125 |
| 6,094,014 * | 7/2000 | Bucks et al. | 315/291 |
| 6,147,458 * | 11/2000 | Bucks et al. | 315/307 |
| 6,236,331 * | 5/2001 | Dussureault | 340/815.45 |

* cited by examiner

Primary Examiner—Josie Ballato
Assistant Examiner—Roberto Rios
(74) Attorney, Agent, or Firm—Kinney & Lange, P.A.

(57) ABSTRACT

A semiconductor based relay is provided for selectively coupling differing periodic power sources to loads through semiconductor switches provided therein while selectively using such power sources to also contribute to the operation of the relay circuitry, each in a different manner, in conjunction with selection signals.

24 Claims, 4 Drawing Sheets

SOLID STATE RELAY

CROSS-REFERENCE TO RELATED APPLICATION

This application is a continuation-in-part of application Ser. No. 09/303,149, filed Apr. 30, 1999 now abandoned.

BACKGROUND OF THE INVENTION

The present invention relates to solid state relays and, more particularly, to solid state relays used in traffic signal light control systems.

Intersecting vehicle thoroughfares often have provided at their intersections standards supporting vehicle traffic control signal lights with one light of each color on each standard visible across the intersection from each of the thoroughfares. These signal lights are typically operated under the control of a control system, including the timing controller and the conflict monitor, housed in a control system cabinet provided in the vicinity of the intersection. The control system and the signal lights are typically operated using alternating current obtained from a commercial electrical power distribution system.

The green, red and yellow signal lights usually used at an intersection, under the direction of the control system, are typically operated to be continuously switched on for selected short time intervals, or are otherwise operated in a switched on-switched off, or flashing, sequence over other selected time intervals. The control system accomplishes such operation of the signal lights through generating signals in the timing controller to close and open load switches that control the supply of alternating currents through a flash transfer relay to the signal lights in those situations in which the signal lights are to be continuously switched on during selected intervals. The flash transfer relay is placed in a first switching state by the conflict monitor during times including those selected intervals that enables the load switches to be effective in selecting those intervals for delivery of alternating current to the lights. In those intervals in which the signal lights are to flash, the conflict monitor directs this condition through the flash transfer relay by changing the relay to another, or second, switching state.

The flash transfer relays provided in typical traffic signal light control systems have traditionally been electromagnetic devices using the presence or the absence of current in a coil to create or end magnetic fields to open or close electrical contacts. These contacts, in the absence of contamination, or other electrical conductivity limiting effects, tend to have very small voltage drops there across during times they are closed and carrying substantial electrical currents therethrough. Thus, they dissipate relatively little electrical power during the carrying of substantial electrical currents therethrough. On the other hand, such contacts suffer from impact recoil so that they rapidly open and close following the first making contact in a switch closing thereby leading to "chattering", and there are discharges between the contacts as they come close to one another leading to "arcing" which causes corrosion and erosion of those contacts. Such contacts, of course, are already subject to contamination from external sources if they are not in a sealed enclosure. In addition, such behavior often leads to the generation of unwanted electrical noise in the circuits connected thereto and in circuits located nearby.

Because of these deficiencies in electromechanical relays, solid state relays have been developed as substitutes in some situations. Such relays use power semiconductor devices which can operate as switches to switch on and off relatively large currents, and can withstand relatively large voltages thereover when switched off. The use of such semiconductor device switches avoids the presence of any moving parts which can wear out, and avoids the use of contacts which are subject to erosion, corrosion and contamination, and thereby also avoids contact chattering and the undue generation of electrical noise. However, such power semiconductor switches do have a relatively large voltage drop there across even when switched on to conduct current therethrough and, thus, these devices are subject to significant electrical energy dissipation.

The use of a solid state relay for flash transfer relays in traffic signal light control systems of typical design is difficult because of the electrical signals available to operate the flash transfer relay. In typical control systems of the past, electromechanical relays were used which merely need to have an alternating current supply provided to the coil thereof whenever relay contacts therein are to be actuated, and removed therefrom when those relay contacts are to no longer be actuated. Thus, such a selectively provided alternating current supply serves as the operating signal for switching the flash transfer relay between switching states thereof.

In some typical traffic signal light control systems, such signal operation control alternating current is always supplied when the signal lights are to be switched on continuously over selected intervals, and this alternating current is removed when the signal lights are to flash (a "energized""energized" system). Other typical signal light control systems are operated in the opposite manner with the signal operation control alternating current being supplied only during instances in which the signal lights are to be flashing, and otherwise not provided when the signal lights are to be switched continuously on over selected intervals (an"deenergized" system).

However, in either type of system, in those situations in which the signal operation control alternating current is not being provided to the flash transfer relay, that relay may not be receiving any electrical power which can be continuously used to operate the circuitry therein which controls the selection of the corresponding switching state thereof. Thus, there is a desire for a solid state relay which can operate as a flash transfer relay in a traffic signal light control system of a typical design.

BRIEF SUMMARY OF THE INVENTION

The present invention provides a semiconductor based relay for selectively coupling differing periodic power sources to loads through semiconductor switches provided therein while selectively using such power sources to also contribute to the operation of the relay circuitry, each in a different manner, in conjunction with selection signals. Such selection signals are provided by a control system which is typically a traffic signal light control system that provides these signals to operate controlled switches for use with the relay serving as a flash transfer relay therein, and with the loads being signal lights. No other sources of electrical energization are typically provided to the flash transfer relay in the control system.

Suitable semiconductor switches are triads activated by bilateral switches. Optical isolation between the bilateral switches and the rest of the relay switching controller is provided. The periodic power source outputs are typically converted to constant polarity waveforms in contributing to the operation of the relay circuitry.

DETAILED DESCRIPTION

Figure 1:
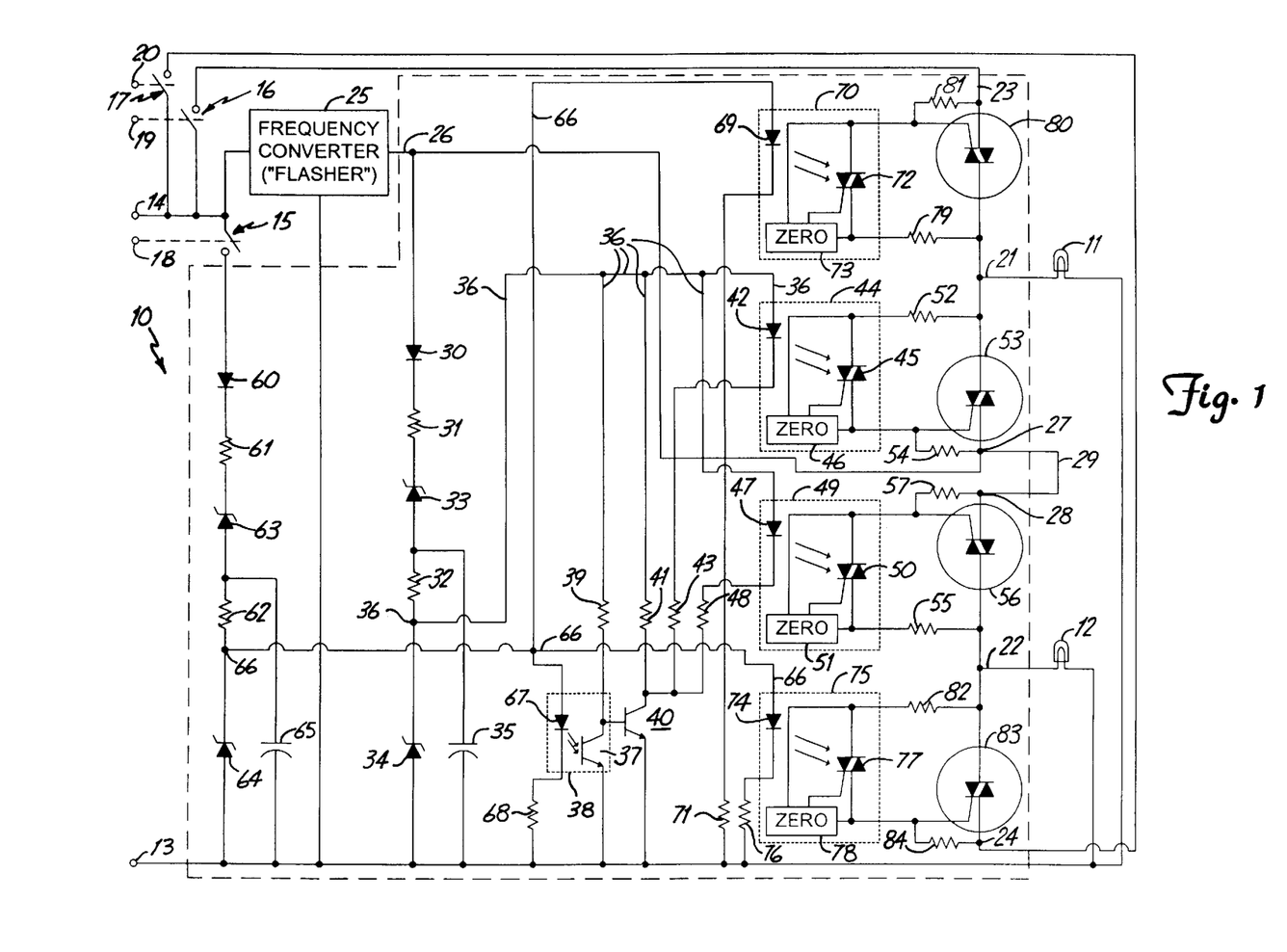
FIG. 1 shows an electrical schematic diagram of a circuit embodying the present invention.

FIG. 1 shows an electrical schematic diagram of a semiconductor device based, or solid state, relay 10, within the dashed line enclosure, serving as a flash transfer relay in a traffic signal light control system (this control system being only partly shown in that figure) of an otherwise typical design as used for conventional control systems offered in the commercial marketplace. Control signals to flash transfer relay 10 select the switching status, or state, of that relay so that the traffic signal lights, 11 and 12, controlled in part thereby are, in one switching state, enabled to be continuously on over time intervals selected by the timing controller load switches or, in another switching state, are operated in an on off alternating sequence, i.e. "flashing" those lights. Control signal lights 11 and 12 may be, for instance, both red colored lights on a standard installed at an intersection, with one of them being observable by people in vehicles or by pedestrians traveling along one street or thoroughfare crossing that intersection. The remaining light would visible along the other street crossing that intersection.

The traffic signal light control system for these lights is typically supplied electrical energy from a commercial source providing voltages and currents therefrom in the form of single phase sinusoidal waveforms characterized by a selected frequency and amplitude, i.e. alternating currents. One typical commercial source provides an approximately constant amplitude voltage single phase sinusoidal waveform with a frequency of 60 Hz and an amplitude of about 115 volts rms. In the portion of the traffic signal light control system shown in FIG. 1, such an electrical energy source would have a neutral conductor correspondingly connected to a zero voltage reference terminal, 13, of relay 10 and a phase conductor correspondingly connected to a phase or "hot" terminal, 14.

Three switches, 15, 16 and 17, are provided in the other portions of the traffic signal lights control system outside of relay 10 with one side of each connected to "hot" terminal 14. These switches are schematically shown in FIG. 1. Switch 15 is provided to control operation of relay 10, and switches 16 and 17 are provided to control continuously on operation of lights 11 and 12 through power switches in relay 10 so as to have this control effectively enabled by relay 10.

Switch 15 is the "flash/automatic" switch which determines the switching state of relay 10, and so whether lights 11 and 12 are enabled to operate in a continuously on condition over selected time intervals or to operate in a flashing condition. The signal for opening and closing switch 15 is provided from the remaining portions of the control system on a terminal, 18, specifically, the conflict monitor.

Switches 16 and 17 are the "load switches" indicated above which are switched, in those situations in which lights 11 and 12 are to be operated continuously on or off over selected time intervals, to set just what the intervals are during which these off or continuously on light operations occur. A control signal from the remaining portions of the control system for controlling the opening and closing of switch 16 appears on a terminal, 19, and a control signal from the remaining portions of the control system for controlling the opening and closing of switch 17 appears on a further terminal, 20. Control signals on terminals 19 and 20 are specifically provided by the timing controller.

Thus, the control signals provided on terminals 19 and 20 from the remaining portions of the control system to open and close switches 16 and 17, respectively, determine if electrical energy is supplied from "hot" terminal 14 to lights 11 and 12 when permitted by the then current switching state of relay 10. Relay 10 enables any such supplying of electrical energy to lights 11 and 12 because switches 16 and 17 are connected to lights 11 and 12 only through relay 10. That is, lights 11 and 12 are electrically connected to a pair of relay power output terminals, 21 and 22, and switches 16 and 17 are electrically connected to a pair of corresponding relay power input terminals, 23 and 24, respectively. Hence, switches 16 and 17, during those times they are switched on, provide electrical energy to lights 11 and 12 to keep them continuously lit only in those situations in which relay 10 is in a switching state in which power input terminal 23 is conductively connected to power output terminal 21 and power input terminal 24 is conductively connected to power output terminal 22 in relay 10.

"Hot" terminal 14, in addition to being connected to switches 15, 16 and 17, is also connected to a power frequency converter, 25, again located in other portions of the traffic signal light control system than is relay 10. Frequency converter 25, commonly referred to as a "flasher", is also connected to reference terminal 13. Flasher 25 provides a sinusoidal waveform at an output thereof, 26, to serve as an electrical energy source for operating lights 11 and 12 during flashing operations. This is accomplished by flasher output 26 being electrically connected to one of two further relay power input terminals, 27 and 28, shown electrically connected together in FIG. 1 through the provision of an external "jumper" interconnection, 29, so that flasher output 26 is connected to both.

Flasher 25 is also used to serve as the electrical energy source for operating other circuitry in relay 10 to thereby overcome the unavailability of an electrical energization supply for this purpose at the location of the flash transfer relay in conventional traffic signal lights control systems. This unavailability, as described above, is the result of commercially offered control systems being designed to accommodate electromechanical relays for use as flash transfer relays which require only the presence or absence of electrical energy in the coil thereof as provided through switch 15 to be placed in an appropriate switching state. Flasher 25 continuously provides typically "on-of" periods of equal duration of a 60 Hz sinusoidal voltage waveform at output 26 thereof having an "on-off" frequency of just 1 Hz and again having an amplitude of about 115 volts rms during "on" periods.

Electrical energy in a constant polarity form for operating circuitry in relay 10 is obtained from flasher 25 by half-wave rectifying the sinusoidal power output waveform provided at output 26 thereof. This rectification is provided by a diode, 30, having its anode connected to flasher output 26 and its cathode connected to a series string of components including a pair of current limiting resistors, 31 and 32, a voltage reducing Zener diode, 33, having a breakdown voltage of 51 volts, and an output voltage determination Zener diode, 34.

Resistor 31 is connected between the cathode of diode 30 and the cathode of Zener diode 33, with resistor 32 connected between the anode of Zener diode 33 and the cathode of Zener diode 34. The anode of Zener diode 34 is connected to reference terminal 13. An electrolytic capacitor, 35, is connected from the junction of the anode of Zener diode 33 and resistor 32 to reference terminal 13 to aid in reducing the voltage variations due to half-wave rectification, i.e. to reduce voltage fluctuations across resistor 32 and output determination Zener diode 34. Thus, a constant polarity relatively constant magnitude voltage of approximately 3.3 volts, the typical breakdown voltage value for output determination Zener diode 34, is provided at a junction interconnection, 36, of resistor 32 and Zener diode 34 as the relay electrical energization operating voltage supplied to portions of the remaining switching control circuitry of relay 10 for operating those circuit portions.

An npn bipolar phototransistor, 37, in a transistor output optoisolator, 38, (typical commercial part: Motorola, Inc. part MOC8113) has its emitter connected to reference terminal 13 and its collector electrically connected through a load resistor, 39, to relay operating voltage interconnection 36. A further npn bipolar transistor, 40, has its base connected to the collector of phototransistor 36 and its emitter connected to reference terminal 13. Transistor 40 has its collector electrically connected through a load resistor, 41, to relay operating voltage interconnection 36.

In addition, the collector of transistor 40 is connected to relay operation power interconnection 36 along two further electrical interconnection paths. In the first of these paths, interconnection 36 has the anode of a light-emitting diode, 42, connected thereto with the cathode of that diode connected through a current limiting resistor, 43, to the collector of transistor 40. Light-emitting diode 42 is in a zero voltage crossing, bilateral switch output optoisolator, 44, (typical commercial part: Motorola, Inc. part MOC3063) in which there is also provided an optically activated silicon bilateral switch, 45, having incorporated therewith a zero-crossing control circuit, 46, (shown in block form only) to cause optically operated bilateral switch 45 to break down within a few volts of zero volts occurring across the main contacts thereof.

In the second further interconnection path between interconnection 36 and the collector of transistor 40, there is a further light-emitting diode, 47, having its anode connected to interconnection 36 and its cathode connected through a further current limiting load resistor, 48, to the collector of transistor 40. Light emitting diode 47 is part of a further zero voltage crossing, bilateral switch output optoisolator, 49, like optoisolator 44, and which also contains an optically activated silicon bilateral switch, 50, along with again a zero-crossing control circuit, 51, shown only in block form. Thus, by switching transistor 40 into an "on" condition, current is drawn through light emitting diodes 42 and 47 along with their series load resistors, and further current is drawn through load resistor 41 all passing through the collector and emitter of transistor 40 to reach reference terminal 13 to which the emitter of transistor 40 is connected. The current drawn through light emitting diodes 42 and 47 is sufficient to cause them to emit light enough to switch on corresponding bilateral switches 45 and 50.

Bilateral switch 45 of optoisolator 44 is connected at a main terminal thereof in series with a current limiting resistor, 52, which resistor is connected at its opposite end to relay power output terminal 21, and to a main terminal of a triac, 53, (typical commercial part: Motorola, Inc. part MAC224A8). Bilateral switch 45 is connected at its other main terminal to the gate of triac 53. A further resistor, 54, is connected between the gate of triac 53 and power input terminal 27 to thereby be connected to the other main terminal of triac 53 which is electrically connected to relay power input 27. Resistor 54 shunts and supplies current to the gate of triac 53, depending on the polarity of the voltage between the main terminals of that triac, to thereby delay the switching of triac 53 into the on condition with either polarity of voltages applied across the main terminals thereof. A "snubber" circuit can be further supplied across these main terminals, as is well known, to control the increases of voltage across, and current through, triac 53.

Similarly, bilateral switch 50 of optoisolator 49 is connected at a main terminal thereof in series with a current limiting resistor, 55, which resistor is connected at its opposite end to relay power output terminal 22, and to a main terminal of a triac, 56. Bilateral switch 50 is connected at its other main terminal to the gate of triac 56. A further resistor, 57, is connected between the gate of triac 56 and power input terminal 28 to thereby be connected to the other main terminal of triac 56. Resistor 57 too shunts and supplies current to the gate of triac 56, depending on the polarity of the voltage between the main terminals of that triac, to thereby delay the switching of triac 56 into the on condition with either polarity of voltages applied there across. A "snubber" circuit can again be used with triac 56 if desired.

This operating circuitry connected to relay operation power interconnection 36, and the associated bilateral switches and triads coupled thereto, are operated under the direction of signals provided from the remaining portions of the control system on terminal 18 controlling the opening and closing of switch 15. Control signals provided on terminal 18 to open and close switch 15 determine whether relay 10 is in a switching state allowing continuously on operation of lights 11 and 12 for intervals determined by load switches 16 and 17, or is in an alternate switching state allowing flashing operation of lights 11 and 12. In a so-called "deenergized" system type of traffic signal lights control system, switch 15 is opened to permit continuous operation of lights 11 and 12 and closed to permit flashing operation of those lights. In a "energized" system type of signal traffic lights control system, just the opposite arrangement is provided with switch 15 being closed to permit continuous operation of lights 11 and 12 and opened to permit flashing operation of those lights. FIG. 1 shows connecting relay 10 into the remainder of the control system in a manner suited for operation in a "energized" system type of traffic signal lights control system.

The closure of switch 15 by a control signal on terminal 18 results in providing a constant polarity voltage signal to direct the operation of the circuitry connected to the relay operation power interconnection 36 just described, and to direct the operation of certain other circuitry to be described below. The opening of switch 15 by control signals on terminal 18 leads to no such constant polarity voltage signal being supplied to such circuitry.

Thus, closure of switch 15 results in the connection of "hot" terminal 14 to another half-wave rectifying arrangement. This rectification is provided by a diode, 60, having its anode connected to the side of switch 15 opposite that to which terminal 14 is connected. The cathode of diode 60 is connected to a series string of components including a pair of current limiting resistors, 61 and 62, a voltage reducing Zener diode, 63, having a breakdown voltage of 51 volts, and an output voltage determination Zener diode, 64.

Resistor 61 is connected between the cathode of diode 60 and the cathode of Zener diode 63, with resistor 62 connected between the anode of Zener diode 63 and the cathode of Zener diode 64. The anode of Zener diode 64 is connected to reference terminal 13. An electrolytic capacitor, 65, is connected from the junction of the anode of Zener diode 63 and resistor 62 to reference terminal 13 to aid in reducing the voltage variations due to half-wave rectification, i.e. to reduce voltage fluctuations across resistor 62 and output determination Zener diode 64. Thus, a constant polarity relatively constant magnitude voltage of approximately 6.2 volts, the typical breakdown voltage value for output determination Zener diode 64, is provided at a junction interconnection, 66, of resistor 62 and Zener diode 64 as a constant polarity signal voltage for directing the switching operations of the switching control circuitry of relay 10.

This constant polarity signal voltage, when present due to the closure of switch 15, is provided across three different light-emitting diode and resistor series combinations all connected to reference terminal 13. The first of these has a light-emitting diode, 67, in optoisolator 38, with its anode electrically connected to signal interconnection 66 and its cathode electrically connected to a current limiting resistor, 68, having its other end connected to reference terminal 13. Thus, the closure of switch 15 results in a current be drawn through diode 67 causing it to emit light to switch on phototransistor 37.

In the absence of voltage on interconnection 66 due to switch 15 being open, phototransistor 37 is switched off resulting in bipolar transistor 40 being switched on because the current in resistor 39 is shunted into the base of transistor 40. As a further result, current is drawn through light-emitting diodes 42 and 47 allowing the voltage on output 26 of flasher 25 to break over bilateral switches 45 and 50 so as to provide currents to and from the gates of triads 53 and 56 depending on the polarity of that voltage. Such currents switch on triads 53 and 56 in each polarity segment of the flasher output voltage supplied thereto on relay power input terminals 27 and 28. Lights 11 and 12 then flash on and off with the frequency of the output voltage waveform of flasher 25 as suitable for a energized system. Closure of switch 15 results in a constant polarity voltage being provided on signal voltage interconnection 66 to switch on phototransistor 37 through light-emitting diode 67, and switch off bipolar transistor 40. Thus, no current is drawn through light-emitting diodes 42 and 47 so that bilateral switches 45 and 50 can no longer break over due to the flasher output voltage waveform on relay power inputs 27 and 28 thereby leaving triads 53 and 56 in the off condition.

The second of the light-emitting diode and resistor series combinations between voltage signal interconnection 66 and terminal 13 has a light-emitting diode 69, in a zero voltage crossing, bilateral switch output optoisolator, 70, like optoisolator 44, with diode 69 having its anode electrically connected to signal interconnection 66 and its cathode electrically connected to a current limiting resistor, 71, that has its other end connected to terminal 13. Optoisolator 70 also contains an optically activated silicon bilateral switch, 72, along again with a zero-crossing control circuit, 73, shown only in block form.

Similarly, the third of the light-emitting diode and resistor series combinations between voltage signal interconnection 66 and terminal 13 has a light-emitting diode 74, in a zero voltage crossing, bilateral switch output optoisolator, 75, like optoisolator 44, with diode 74 having its anode electrically connected to signal interconnection 66 and its cathode electrically connected to a current limiting resistor, 76, that has its other end connected to terminal 13. Optoisolator 75 also contains an optically activated silicon bilateral switch, 77, along again with a zero-crossing control circuit, 78, once more shown only in block form.

Bilateral switch 72 of optoisolator 70 is connected at a main terminal thereof in series with a current limiting resistor, 79, which resistor is connected at its opposite end to relay power output terminal 21, and to a main terminal of a triac, 80. Bilateral switch 72 is connected at its other main terminal to the gate of triac 80. A further resistor, 81, is connected between the gate of triac 80 and power input terminal 23 to thereby be connected to the other main terminal of triac 80 which is electrically connected to relay power input 23. Resistor 81 shunts and supplies current to the gate of triac 80, depending on the polarity of the voltage between the main terminals of that triac, to thereby delay the switching of triac 80 into the on condition with either polarity of voltages applied across the main terminals thereof.

Similarly, bilateral switch 77 of optoisolator 75 is connected at a main terminal thereof in series with a current limiting resistor, 82, which resistor is connected at its opposite end to relay power output terminal 22, and to a main terminal of a triac, 83. Bilateral switch 77 is connected at its other main terminal to the gate of triac 83. A further resistor, 84, is connected between the gate of triac 83 and power input terminal 24 to thereby be connected to the other main terminal of triac 83. Resistor 84 too shunts and supplies current to the gate of triac 83, depending on the polarity of the voltage between the main terminals of that triac, to thereby delay the switching of triac 83 into the on condition with either polarity of voltages applied there across. "Snubber" circuits can also be used with triacs 80 and 83 as desired.

In the absence of voltage on interconnection 66 due to switch 15 being open, no current is drawn through light-emitting diodes 69 and 74 so that bilateral switches 72 and 77 can not break over in the presence of any voltages provided thereto on relay power inputs 23 and 24 through load switches 16 and 17, respectively, to thus leave triacs 80 and 83 in the off condition. Closure of switch 15 results in voltage on signal voltage interconnection 66 so that current is drawn through light-emitting diodes 69 and 74 allowing any output voltages provided through load switches 16 and 17 on relay power inputs 23 and 24 to break over bilateral switches 72 and 77, respectively, so as to provide currents to and from the gates of triacs 80 and 83 depending on the polarity of that voltage. Any such currents, resulting from the closure of load switches 16 and 17, switch on triacs 80 and 83 in each polarity segment of the voltage supplied thereto on relay power input terminals 23 and 23 through load switches 16 and 17.

Figure 2:
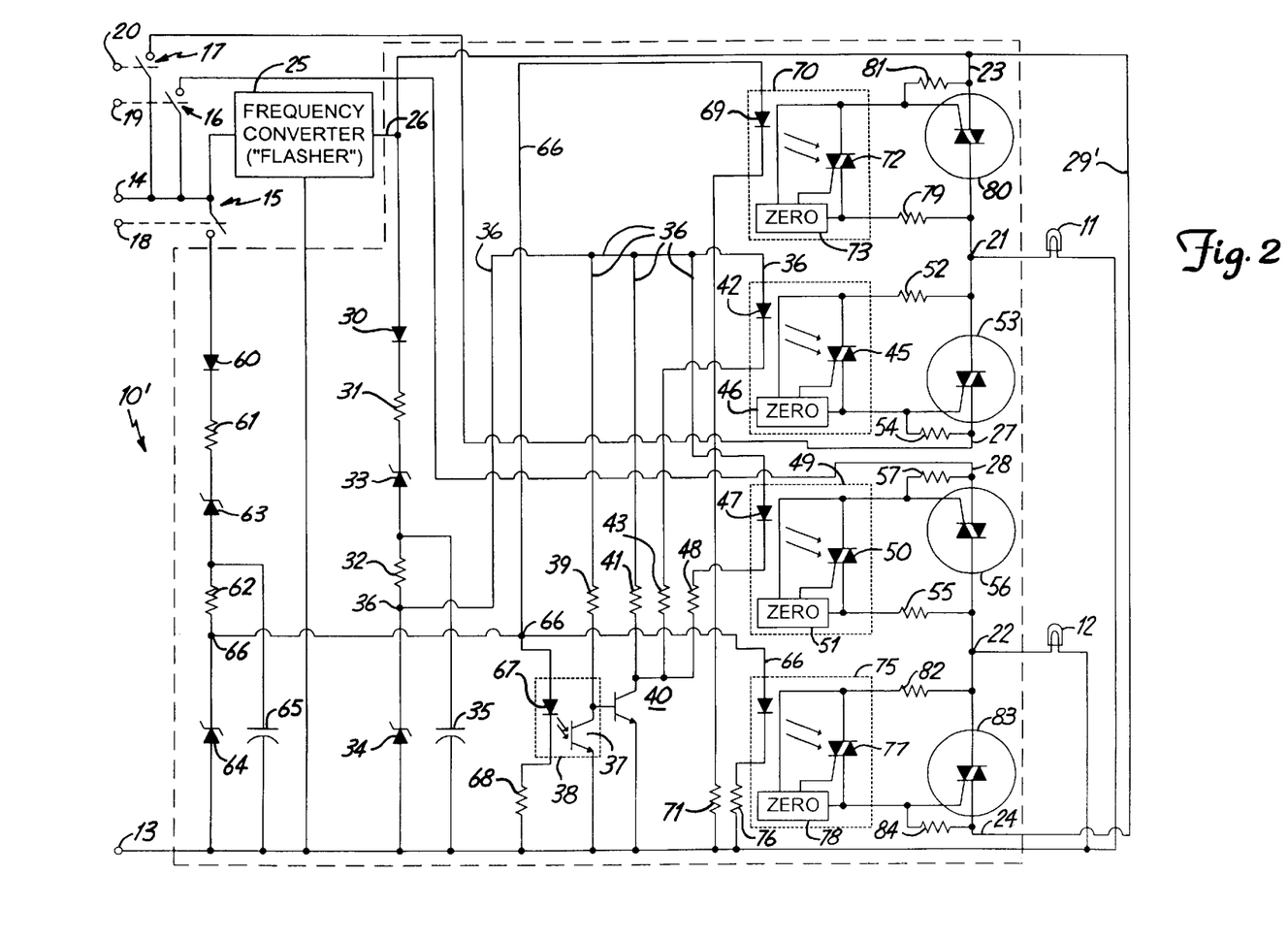
FIG. 2 shows an electrical schematic drawing of an alternative circuit embodying the present invention

FIG. 2 is an electrical schematic diagram showing the connecting into the remainder of the control system of a flash transfer relay, 10', within the dashed line enclosure, of essentially the solid state relay type nature described above but in a manner suited for operation in an "deenergized" system type of traffic signal lights control system. In general, relay 10' is constructed like, and operates like, relay 10 of FIG. 1. Components shown in FIG. 2 that are essentially the same as the corresponding ones shown in FIG. 1 have the same numerical designations in each figure. Relay 10' also operates with the same kinds of electrical energization and with the same kinds of control signals though the control signal provided on terminal 18 in FIG. 2 will be the complement of that provided on terminal 18 in FIG. 1 because of being an "deenergized" system type rather than a "energized" system type.

Relay 10 of FIG. 1, in being for control systems of the "energized" system type, has lights 11 and 12 flashing on and off in the absence of voltage on voltage signal interconnection 66 because of switch 15 being open. Since, in this situation, triacs 53 and 56 are switched on, i.e. "normally closed" with switch 15 open, output 26 of flasher 25 is connected to the relay power input terminals connected to these triacs, or terminals 27 and 28. Triacs 80 and 83 are switched off in this situation, i.e. are "normally open" with switch 15 open, and they are connected through relay power input terminals 23 and 24 to load switches 16 and 17, respectively, so that switch 15 must be closed for lights 11 and 12 to be lit continuously by any closures of load switches 16 and 17.

On the other hand, relay 10' of FIG. 2, in being for control systems of the "deenergized" system type, has lights 11 and 12 flashing on and off in the presence of voltage on voltage signal interconnection 66 because of switch 15 being closed. Since, in this situation, triacs 80 and 83 are switched on, i.e. "normally closed" with switch 15 closed (though still "normally open" in the conventional sense with no signal applied, i.e. with switch 15 open), output 26 of flasher 25 is connected to one of the relay power input terminals connected to these triacs, or terminals 23 and 24, with an external "jumper" interconnection, 29', connecting them together rather than being connected to relay power input terminals 27 and 28. Triacs 53 and 56 are switched off in this situation of switch 15 closed, i.e. are "normally open" with switch 15 closed (though still "normally closed" in the conventional sense with no signal applied, i.e. with switch 15 open), and they are connected through relay power input terminals 27 and 28 to load switches 16 and 17, respectively, rather than to relay power input terminals 23 and 24 so that switch 15 must be opened for lights 11 and 12 to be lit continuously by any closures of load switches 16 and 17.

Figure 3:
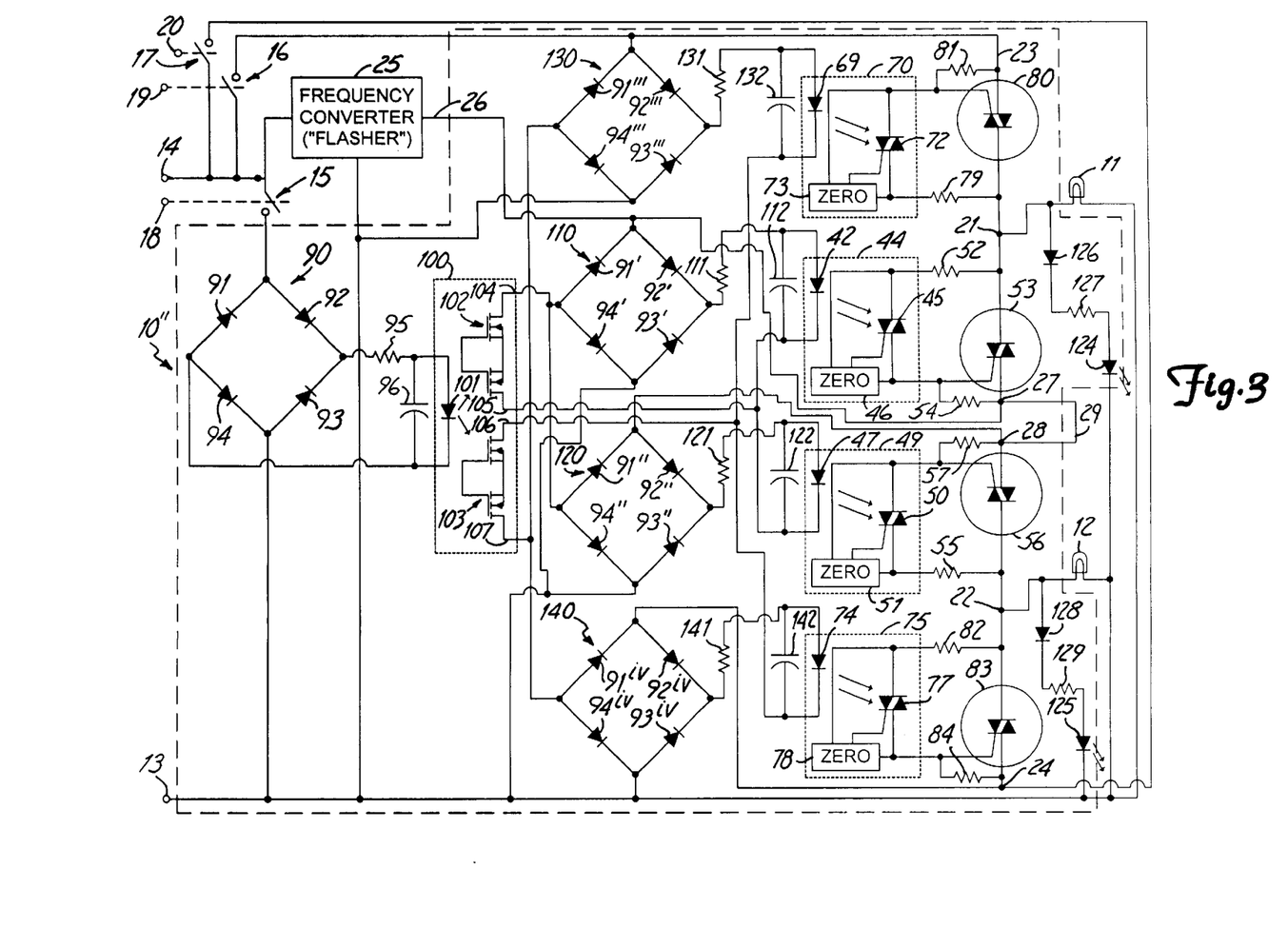
FIG. 3 shows an electrical schematic drawing of another alternative circuit embodying the present invention.

FIG. 3 is an electrical schematic diagram showing the connecting into the remainder of the control system of a flash transfer relay, 10", within the dashed line enclosure, of essentially the solid state relay type nature described above in connection with FIG. 1 as an alternative thereto, and again connected in a manner suited for operation in a "energized" system type of traffic signal lights control system. In general, relay 10" operates like relay 10 of FIG. 1 but is instead constructed using bridge rectifiers for alternating current rectification. Components shown in FIG. 3 that are essentially the same as the corresponding ones shown in FIG. 1 have the same numerical designations in each figure. Relay 10" also operates with the same kinds of electrical energization and with the same kinds of control signals as are used in the system of FIG. 1.

"Hot" terminal 14 here, in addition to being connected to switches 15, 16 and 17, is also again connected to power frequency converter 25 located in other portions of the traffic signal light control system than is relay 10". Frequency converter 25 is, as before, also connected to reference terminal 13. Flasher 25 provides a sinusoidal waveform at output 26 thereof to serve as an electrical energy source for operating lights 11 and 12 during flashing operations. That is, flasher 25 continuously provides typically "on-off" periods of equal duration of a 60 Hz sinusoidal voltage waveform at output 26 thereof having an "on-off" frequency of just 1 Hz and again having an amplitude of about 115 volts rms during "on" periods. Again, this is accomplished by flasher output 26 being electrically connected to one of relay power input terminals 27 and 28 also shown electrically connected together in FIG. 3 through the provision of external "jumper" interconnection 29 so that flasher output 26 is connected to both. In system 10", however, flasher 25 is not used as an electrical energy source for operating other circuitry to relay 10". Instead, all electrical energy is obtained from "hot" terminal 14 after suitable switching and rectification. As before, lights 11 and 12 are electrically connected to corresponding relay power output terminals 21 and 22, respectively, and switches 16 and 17 are electrically connected to corresponding relay power input terminals 23 and 24, respectively.

This operating circuitry of relay 10" is operated under the direction of signals provided from the remaining portions of the control system on terminal 18 controlling the opening and closing of switch 15. Control signals provided on terminal 18 to open and close switch 15 determine whether relay 10" is in a switching state allowing continuously on operation of lights 11 and 12 for intervals determined by load switches 16 and 17, or is in an alternate switching state allowing flashing operation of lights 11 and 12. In this "energized" system type of signal traffic lights control system, switch 15 is closed to permit continuous operation of lights 11 and 12 and opened to permit flashing operation of those lights.

The closure of switch 15 by a control signal on terminal 18 results in providing a constant polarity voltage signal to direct the operation of the circuitry coupled thereto. The opening of switch 15 by control signals on terminal 18 leads to no such constant polarity voltage signal being supplied to such circuitry.

Thus, closure of switch 15 results in the electrical connection of "hot" terminal 14 to a full-wave rectifying arrangement. This rectification is provided by a diode bridge rectifier, 90, having the cathode of a diode, 91, and the anode of a diode, 92, electrically connected to the side of switch 15 opposite that to which terminal 14 is connected to form the alternating current input terminal. The cathode of diode 92 is electrically connected to the cathode of another diode, 93, to form the more positive constant polarity voltage terminal of the bridge rectifier. The anode of diode 91 is electrically connected to the anode of a final diode, 94, in the bridge to form the more negative constant polarity voltage bridge terminal. A last connection in the bridge has the cathode of diode 94 electrically connected to the anode of diode 93 and to ground reference terminal 13.

The more positive constant polarity voltage terminal of bridge rectifier 90 is electrically connected through a current limiting resistor, 95, to a ripple reducing, noise limiting capacitor, 96, having its other side electrically connected to the more negative constant polarity voltage terminal of bridge rectifier 90. Capacitor 96 is also electrically connected across the input terminals of an input controlled, optically isolated, two pole switch, 100, (typical commercial part: C. P. Clare Corporation part LCC110) each of which inputs is electrically connected to a corresponding one of the opposite sides of a light-emitting diode, 101, in optically isolated two pole switch 100. Diode 101 has its anode electrically connected to the junction of resistor 95 and capacitor 96 and its cathode electrically connected to the other side of capacitor 96 and so to the more negative constant polarity voltage terminal of bridge rectifier 90. Thus, the closure of switch 15 results in a current being drawn through diode 101 causing it to emit light in optically isolated two pole switch 100.

This light, when emitted by diode 101, impinges on an integrated array of photovoltaic cells in circuitry electrically connected to the gates of each of two pairs of light responding metal-oxide-semiconductor field-effect transistors (MOSFET's), 102 and 103, that provide the two pole switching function in response to current through the diode, the MOSFET's in each pair being n-channel devices having their channel regions connected electrically in series with one another. Thus, MOSFET pair 102 are each depletion mode devices and the series connected channels thereof are electrically connected between two single pole switch terminals, 104 and 105, of two pole switch 100 to form a normally closed single pole switch therebetween in the absence of emitted light from diode 101 which switch opens upon such emission. MOSFET pair 103 are enhancement mode devices and the series connected channels thereof are electrically connected between two single pole switch terminals, 106 and 107, of switch 100 to form a normally open single pole switch therebetween in the absence of such light which switch closes upon such emission.

Controlled switch 100 output terminal 104 is electrically connected to the more negative constant polarity voltage bridge terminals of two further diode bridge rectifiers, 110 and 120, each operating like diode bridge rectifier 90 with the same diode configuration. Thus, the diodes in bridge rectifiers 110 and 120 are designated as in bridge rectifier 90 except prime marks are added to the designations of the first (91', 92', 93' and 94') and double prime marks are added to the designations of the second (91", 92", 93" and 94"). The alternating input terminals of bridge rectifiers 110 and 120 are each electrically connected to output 26 of flasher 25 with that of rectifier 120 being so connected through jumper 29. The ground reference terminals of bridge rectifiers 110 and 120 are again electrically connected to reference terminal 13.

The more positive constant polarity voltage terminal of bridge rectifier 110 is electrically connected through a current limiting resistor, 111, to a ripple reducing, noise limiting capacitor, 112, having its other side electrically connected to controlled switch 100 single pole switch terminal 105, and so to the more negative constant polarity voltage terminal of bridge rectifier 110 through single pole switch 102. Capacitor 112 is also electrically connected across the input terminals of zero voltage crossing, bilateral switch output optoisolator 44 (here, typically commercial part: Toshiba, Inc. part TLP3063) each of which inputs is electrically connected to a corresponding one of the opposite sides of light-emitting diode 42. Light emitting diode 42 is in optoisolator 44 again with optically activated silicon bilateral switch 45 having incorporated therewith zero-crossing control circuit 46 to cause optically operated bilateral switch 45 to break down within a few volts of zero volts occurring across the main contacts thereof Diode 42 has its anode electrically connected to the junction of resistor 111 and capacitor 112 and its cathode electrically connected to the other side of capacitor 112, and so to single pole switch terminal 105 and the more negative constant polarity voltage terminal of bridge rectifier 110 through single pole switch 102.

Similarly, the more positive constant polarity voltage terminal of bridge rectifier 120 is electrically connected through a current limiting resistor, 121, to a ripple reducing, noise limiting capacitor, 122, having its other side electrically connected to controlled switch 100 single pole switch terminal 105, and so to the more negative constant polarity voltage terminal of bridge rectifier 120 through single pole switch 102. Capacitor 122 is also electrically connected across the input terminals of zero voltage crossing, bilateral switch output optoisolator 49, like optoisolator 44, each of which inputs is electrically connected to a corresponding one of the opposite sides of light-emitting diode 47. Light emitting diode 47 is in optoisolator 49 again with optically activated silicon bilateral switch 50 having incorporated therewith zero-crossing control circuit 51 to cause optically operated bilateral switch 50 to break down within a few volts of zero volts occurring across the main contacts thereof. Diode 47 has its anode electrically connected to the junction of resistor 121 and capacitor 122 and its cathode electrically connected to the other side of capacitor 122, and so to single pole switch terminal 105 and the more negative constant polarity voltage terminal of bridge rectifier 120 through single pole switch 102. The current drawn through light-emitting diodes 42 and 47 is again sufficient to cause them to emit light enough to switch on corresponding bilateral switches 45 and 50.

In a similar arrangement, controlled switch 100 output terminal 106 is electrically connected to the more negative constant polarity voltage bridge terminals of two further diode bridge rectifiers, 130 and 140, each operating like diode bridge rectifier 90 with the same diode configuration. Thus, the diodes in bridge rectifiers 130 and 140 are again designated as in bridge rectifier 90 except triple prime marks are added to the designations of the first (91''', 92''', 93''' and 94''') and equivalent quadruple prime marks are added to the designations of the second (91$^{iv}$, 92$^{iv}$, 93$^{iv}$ and 94$^{iv}$). The alternating input terminals of bridge rectifiers 130 and 140 are each electrically connected to a corresponding one of relay power output terminals 23 and 24. The reference terminals of bridge rectifiers 130 and 140 are again electrically connected to reference terminal 13.

The more positive constant polarity voltage terminal of bridge rectifier 130 is electrically connected through a current limiting resistor, 131, to a ripple reducing, noise limiting capacitor, 132, having its other side electrically connected to controlled switch 100 single pole switch terminal 107, and so to the more negative constant polarity voltage terminal of bridge rectifier 130 through single pole switch 103. Capacitor 132 is also electrically connected across the input terminals of zero voltage crossing, bilateral switch output optoisolator 70, like optoisolator 44, each of which inputs is electrically connected to a corresponding one of the opposite sides of light-emitting diode 69. Light emitting diode 69 is in optoisolator 70 again with optically activated silicon bilateral switch 72 having incorporated therewith zero-crossing control circuit 73 to cause optically operated bilateral switch 72 to break down within a few volts of zero volts occurring across the main contacts thereof. Diode 69 has its anode electrically connected to the junction of resistor 131 and capacitor 132 and its cathode electrically connected to the other side of capacitor 132, and so to single pole switch terminal 107 and the more negative constant polarity voltage terminal of bridge rectifier 130 through single pole switch 103.

Similarly, the more positive constant polarity voltage terminal of bridge rectifier 140 is electrically connected through a current limiting resistor, 141, to a ripple reducing, noise limiting capacitor, 142, having its other side electrically connected to controlled switch 100 single pole switch terminal 107, and so to the more negative constant polarity voltage terminal of bridge rectifier 140 through single pole switch 103. Capacitor 142 is also electrically connected across the input terminals of zero voltage crossing, bilateral switch output optoisolator 75, like optoisolator 44, each of which inputs is electrically connected to a corresponding one of the opposite sides of light-emitting diode 74. Light emitting diode 74 is in optoisolator 75 again with optically activated silicon bilateral switch 77 having incorporated therewith zero-crossing control circuit 78 to cause optically operated bilateral switch 77 to break down within a few volts of zero volts occurring across the main contacts thereof. Diode 74 has its anode electrically connected to the junction of resistor 141 and capacitor 142 and its cathode electrically connected to the other side of capacitor 142, and so to single pole switch terminal 107 and the more negative constant polarity voltage terminal of bridge rectifier 140 through single pole switch 103. The current drawn through light-emitting diodes 69 and 74 is again sufficient to cause them to emit light enough to switch on corresponding bilateral switches 72 and 77.

When switch 15 is in the open position so that there is no direct current from bridge 90 through diode 101, controlled switch 100 has internal switches 102 and 103 in their energized states, i.e. in their normal states in the absence of impinging light. In this situation, as indicated above, switch 102 will be closed in its normally closed state, and switch 103 will be open in its normally open state thereby allowing no significant current to be established therethrough. Switch 102 being closed, however, and having the more negative constant polarity voltage terminals of bridge rectifiers 110 and 120 each connected to single pole switch terminal 105, effectively connects them also to single pole switch terminal 104 so that current can flow in two further electrical interconnection paths.

In the first of these paths, direct current flows from the more positive constant polarity voltage terminal of bridge rectifier 110 through resistor 111, capacitor 112, and diode 42 to the more negative constant polarity voltage terminal of bridge rectifier 110 through switch 102. Thereby, capacitor 112 is charged and the voltage applied across light emitting diode 42 is stabilized.

In the second further interconnection path, direct current flows from the more positive constant polarity voltage terminal of bridge rectifier 120 through resistor 121, capacitor 122, and diode 47 to the more negative constant polarity voltage terminal of bridge rectifier 120 through switch 102. Thereby, capacitor 122 is charged and the voltage applied across light emitting diode 47 is stabilized The remainders of the circuits connected to optoisolators 44 and 49 involving triacs 53 and 56 operate as described above in connection with FIG. 1. In the presence of current being drawn through light-emitting diodes 42 and 47 due to switch 15 being open, the output voltage provided through flasher 25 in the closed condition on relay power inputs 27 and 28 can break over bilateral switches 45 and 50, respectively, so as to provide currents to and from the gates of triacs 53 and 56 depending on the polarity of that voltage. Such voltages switch on triacs 53 and 56 in each polarity segment of the voltage supplied thereto on relay power input terminals 27 and 28 through flasher 25 allowing current to be drawn through lamps 11 and 12.

Also, a small fraction of any such currents will be used to also cause coinciding light emission in a corresponding one of a pair of output indicator light emitting diodes, 124 and 125, each having its cathode electrically connected to reference terminal 13. In association with the switching on of lamp 11, voltage at relay power output terminal 21 is half-wave rectified by a diode, 126, having its anode electrically connected thereto, and the current drawn therethrough, and through diode 124, is limited by a resistor, 127, which is electrically connected in series between the cathode of diode 126 and the anode of diode 124. In association with the switching on of lamp 12, voltage at relay power terminal 22 is half-wave rectified by diode 128, having its anode electrically connected thereto, and the current drawn therethrough, and through diode 125, is limited by a resistor, 129, which is electrically connected in series between the cathode of diode 128 and the anode of diode 125.

When switch 15 is alternatively in the closed position so that there is direct current from bridge 90 through diode 101, controlled switch 100 has internal switches 102 and 103 in their deenergized states, i.e. in states opposite their normal states in the absence of impinging light. In this situation, as indicated above, switch 102 will be open as opposed to its normally closed state, thereby allowing no significant current to be established therethrough, and switch 103 will be closed as opposed to its normally open state. Switch 103 being closed, however, and having the more negative constant polarity voltage terminals of bridge rectifiers 130 and 140 each connected to single pole switch terminal 107, effectively connects them also to single pole switch terminal 106 so that current can flow in two further electrical interconnection paths if load switches 16 and 17 are also closed to provide alternating voltage to the alternating current inputs of bridge rectifiers 130 and 140 as well as relay power output terminals 23 and 24.

In the first of these paths, direct current flows from the more positive constant polarity voltage terminal of bridge rectifier 130 through resistor 131, capacitor 132, and diode 69 to the more negative constant polarity voltage terminal of bridge rectifier 130 through switch 103. Thereby, capacitor 132 is charged and the voltage applied across light emitting diode 69 is stabilized.

In the second further interconnection path, direct current flows from the more positive constant polarity voltage terminal of bridge rectifier 140 through resistor 141, capacitor 142, and diode 74 to the more negative constant polarity voltage terminal of bridge rectifier 140 through switch 103. Thereby, capacitor 132 is charged and the voltage applied across light emitting diode 74 is stabilized.

The remainders of the circuits connected to optoisolators 70 and 75 involving triacs 80 and 83 also operate as described above in connection with FIG. 1. In the presence of current being drawn through light-emitting diodes 69 and 74 due to switch 15 being closed, the output voltage provided through load switches 16 and 17 in the "on" on relay power inputs 23 and 24 can break over bilateral switches 72 and 77, respectively, so as to provide currents to and from the gates of triacs 80 and 83 depending on the polarity of that voltage. Such voltages switch on triacs 80 and 83 in each polarity segment of the voltage supplied thereto on relay power input terminals 23 and 24 through load switches 16 and 17, respectively, allowing current to be drawn through lamps 11 and 12.

Again, a small fraction of any such currents will be used to also cause light emission in the corresponding one of output indicator light emitting diodes 124 and 125 coinciding with switching on of the corresponding one of lamps 11 and 12. Output indicator light emitting diodes 124 and 125 are located to be exposed visually to the exterior of the enclosure for relay 10" so that an observer can receive indications of when lamps 11 and 12 have been switched on without having to observe them directly.

Figure 4:
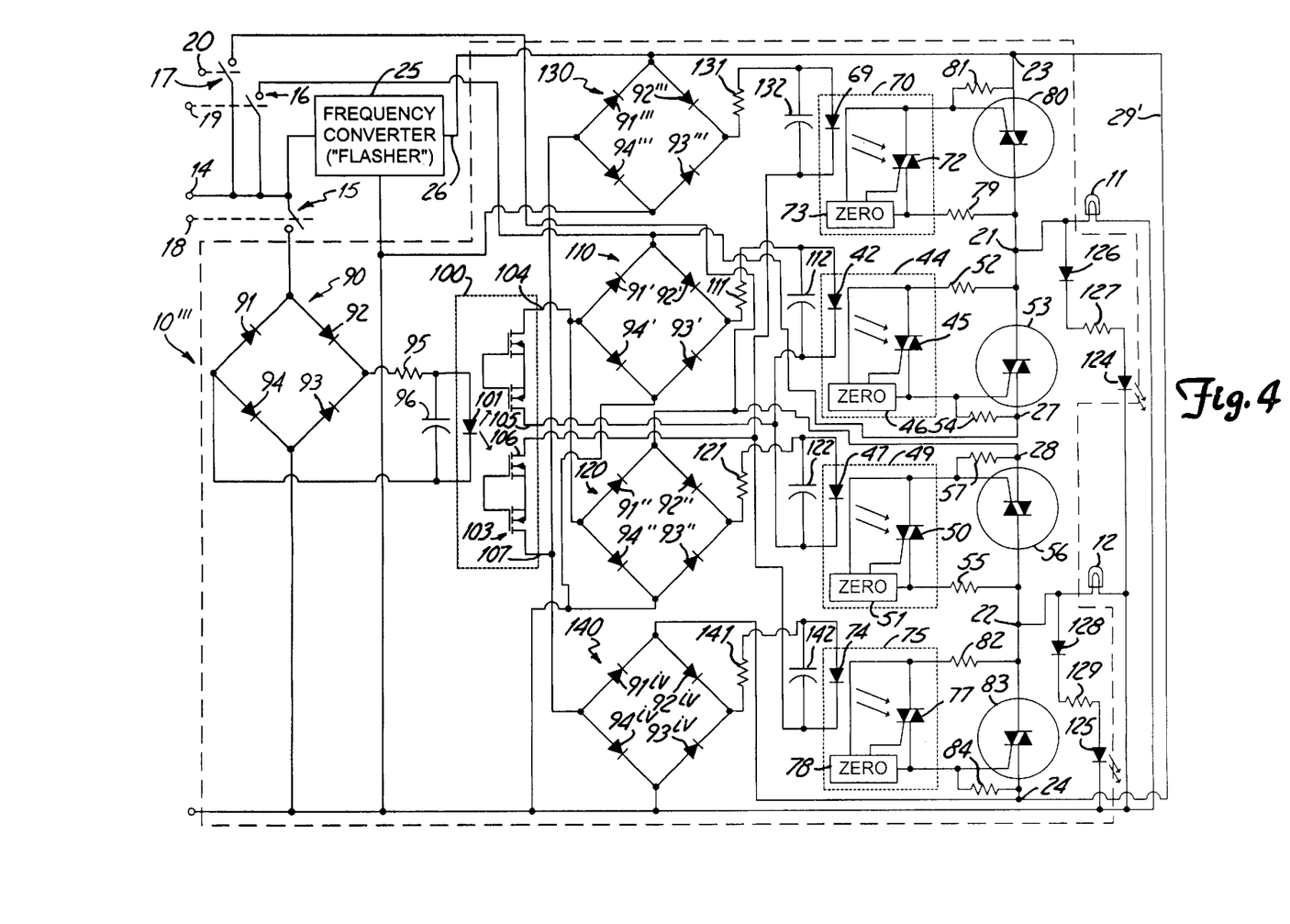
FIG. 4 shows an electrical schematic drawing of a further alternative circuit embodying the present invention.

FIG. 4 is an electrical schematic diagram showing the connecting into the remainder of the control system of a flash transfer relay, 10''', within the dashed line enclosure, of essentially the solid state relay type nature described above in connection with FIG. 3 but in a manner suited for operation in an "deenergized" system type of traffic signal lights control system. In general, relay 10''' is constructed like, and operates like, relay 10'' of FIG. 3. Components shown in FIG. 4 that are essentially the same as the corresponding ones shown in FIG. 3 have the same numerical designations in each figure. Relay 10''' also operates with the same kinds of electrical energization and with the same kinds of control signals though the control signal provided on terminal 18 in FIG. 4 will be the complement of that provided on terminal 18 in FIG. 3 because of being an "deenergized" system type rather than a "energized" system type.

Relay 10″ of FIG. 3, in being for control systems of the "energized" system type, has lights 11 and 12 flashing on and off in the absence of a conductive path through single pole switch 103 because of switch 15 being open. Since, in this situation, triacs 53 and 56 are switched on, i.e. "normally closed" with switch 15 open, output 26 of flasher 25 is connected to the relay power input terminals connected to these triacs, or terminals 27 and 28. Triacs 80 and 83 are switched off in this situation, i.e. are "normally open" with switch 15 open, and they are connected through relay power input terminals 23 and 24 to load switches 16 and 17, respectively, so that switch 15 must be closed for lights 11 and 12 to be lit continuously by any closures of load switches 16 and 17.

On the other hand, relay 10‴ of FIG. 4, in being for control systems of the "deenergized" system type, has lights 11 and 12 flashing on and off in the presence of a conductive path through single pole switch 103 because of switch 15 being closed. Since, in this situation, triacs 80 and 83 are switched on, i.e. "normally closed" with switch 15 closed (though still "normally open" in the conventional sense with no signal applied, i.e. with switch 15 open), output 26 of flasher 25 is connected to one of the relay power input terminals connected to these triacs, or terminals 23 and 24, with an external "jumper" interconnection, 29', connecting them together rather than being connected to relay power input terminals 27 and 28. Triacs 53 and 56 are switched off in this situation of switch 15 closed, i.e. are "normally open" with switch 15 closed (though still "normally closed" in the conventional sense with no signal applied, i.e. with switch 15 open), and they are connected through relay power input terminals 27 and 28 to load switches 16 and 17, respectively, rather than to relay power input terminals 23 and 24 so that switch 15 must be opened for lights 11 and 12 to be lit continuously by any closures of load switches 16 and 17.

Although the present invention has been described with reference to preferred embodiments, workers skilled in the art will recognize that changes may be made in form and detail without departing from the spirit and scope of the invention.

What is claimed is:

1. A semiconductor device based relay for controlling from a relay control input which of relay first and second relay power inputs are electrically connected therethrough to a relay first power output, said relay control input being suited for selective coupling to a first periodic electrical energization source, said relay first power output being suited for selective coupling to a corresponding one of a second and said first periodic electrical energization sources, and said relay first and second power inputs being suited for selective coupling to a corresponding one of said first and second periodic electrical energization sources, said relay comprising:

first and second semiconductor switches each having first and second terminating regions and a control input by which said semiconductor switch is capable of being directed to provide a conductive path between said first and second terminating regions thereof, said first and second semiconductor switches first terminating regions each being electrically connected to said first relay power output, said first semiconductor switch second terminating region being electrically connected to said relay first power input and said second semiconductor switch second terminating region being electrically connected to said relay second power input;

a control converter having an output, and having an input coupled to said relay control input, said control converter providing a constant polarity control signal at said output thereof in response to said control converter input being electrically energized from said first periodic electrical energization source;

an operation converter having an output, and having an input suited for electrical connection to said second periodic electrical energization source, said operation converter providing a constant polarity operational electrical energy at said output thereof in response to said operation converter input being electrically energized from said second periodic electrical energization source; and a switching controller having an input coupled to said control converter output, a constant polarity electrical energization input electrically connected to said operation converter output, and having first and second outputs each coupled to a corresponding one of said first and second semiconductor switches control inputs, said switching controller for providing a switching signal based at least in part on said constant polarity operational electrical energy provided on said constant polarity electrical energization input thereof to just one of said first and second outputs thereof in response to said constant polarity control signal appearing on said control converter output, and of providing such a said switching signal on just that remaining one of said first and second outputs thereof absent said constant polarity control signal appearing on said control converter output.

2. The apparatus of claim 1 wherein said relay is provided in a traffic signal light control system and said first periodic electrical energization source is selectively provided to said relay control input through a flash decision switch in said control system operated by remaining portions of said control system to select which of said first and second semiconductor switches is to have a conductive path provided between said first and second terminating regions thereof.

3. The apparatus of claim 1 wherein said relay is provided in a traffic signal light control system and said first periodic electrical energization source is selectively provided to a corresponding one of said first and second relay power inputs through a load switch in said control system operated by remaining portions of said control system to select when said first periodic electrical energization source is to be coupled thereto.

4. The apparatus of claim 1 wherein said relay is provided in a traffic signal light control system and said second periodic electrical energization source is selectively provided to a corresponding one of said first and second relay power inputs and to said operation converter input.

5. The apparatus of claim 1 wherein each of said first and second semiconductor switches comprises a triac having first and second main terminals serving as said first and second terminating regions thereof and a gate terminal with an optically activated bilateral switch coupled between said gate terminal and a corresponding one of said first and second main terminals, and with said control input being provided by a light-emitting diode optically coupled to said bilateral switch.

6. The apparatus of claim 1 further comprising third and fourth semiconductor switches each having first and second terminating regions and a control input by which said semiconductor switch is capable of being directed to provide a conductive path between said first and second terminating regions thereof, said third and fourth semiconductor switches first terminating regions each being electrically connected to a second relay power output suited for selective coupling to a corresponding one of said first and second periodical electrical energization sources, said third semiconductor switch second terminating region being electrically connected to a third relay power input and said fourth semiconductor switch second terminating region being electrically connected to a fourth relay power input, said third and fourth relay power inputs being suited for selective coupling to a corresponding one of said first and second periodical electrical energization sources, said switching controller first and second outputs each coupled to a corresponding one of said third and fourth semiconductor switches control inputs.

7. The apparatus of claim 1 wherein said relay is provided in a traffic signal light control system and said traffic signal light control system provides solely said first and second periodical electrical energization sources to said relay as electrical energization sources therefor.

8. The apparatus of claim 2 wherein said first and second periodical electrical energization sources differ in frequency.

9. The apparatus of claim 3 wherein said first and second periodical electrical energization sources differ in frequency.

10. The apparatus of claim 4 wherein said first and second periodical electrical energization sources differ in frequency.

11. The apparatus of claim 5 wherein said relay is provided in a traffic signal light control system and a signal light is coupled to said relay first power output.

12. The apparatus of claim 6 wherein each of said third and fourth semiconductor switches comprises a triac having first and second main terminals serving as said first and second power terminating regions thereof and a gate terminal with an optically activated bilateral switch coupled between said gate terminal and a corresponding one of said first and second main terminals, and with said control input being provided by a light-emitting diode optically coupled to said bilateral switch, said relay being provided in a traffic signal light control system with a first signal light coupled to said relay first power output and with a second signal light coupled to said relay second power output.

13. A semiconductor device based relay for controlling from a relay control input which of relay first and second relay power inputs are electrically connected therethrough to a relay first power output, said relay control input being suited for selective coupling to a first periodic electrical energization source, said relay first power output being suited for selective coupling to a corresponding one of a second and said first periodic electrical energization sources, and said relay first and second power inputs being suited for selective coupling to a corresponding one of said first and second periodic electrical energization sources, said relay comprising:

first and second semiconductor switches each having first and second terminating regions and a control input by which said semiconductor switch is capable of being directed to provide a conductive path between said first and second terminating regions thereof, said first and second semiconductor switches first terminating regions each being electrically connected to said first relay power output, said first semiconductor switch second terminating region being electrically connected to said relay first power input and said second semiconductor switch second terminating region being electrically connected to said relay second power input;

a control converter having an output, and having an input coupled to said relay control input, said control converter providing a constant polarity control signal at said output thereof in response to said control converter input being electrically energized from said first periodic electrical energization source;

a switching controller having an input coupled to said control converter output, and having first and second supervisory switches each having first and second terminating regions and a control input responsive to signals at said switching controller input by which said supervisory switch is capable of being directed to provide or remove a conductive path between said first and second terminating regions thereof;

a first pair of operation converters each having first and second outputs with said first output thereof being electrically connected to a corresponding one of said first and second supervisory switches first terminating regions, and having an input suited for electrical connection for selective coupling to a corresponding one of said first and second periodic electrical energization sources, said pair of operation converters each being capable of providing a constant polarity operational electrical energy between said first and second outputs thereof in response to being electrically energized from a corresponding one of said first and second periodic electrical energization sources; and a switching coupler having a first pair of inputs electrically connected between a corresponding one of said second outputs of said first pair of operation converters and a corresponding one of said first and second supervisory switches second terminating regions, a second pair of inputs electrically connected between a corresponding one of said second outputs of said first pair of operation converters and a corresponding one of said first and second supervisory switches second terminating regions, and having first and second outputs each coupled to a corresponding one of said first and second semiconductor switches control inputs, said switching coupler for providing a switching signal based at least in part on said constant polarity operational electrical energy provided between said first and second outputs of one of said first pair of operation converters to just one of said first and second outputs thereof in response to said constant polarity control signal appearing on said control converter output, and of providing such a said switching signal on just that remaining one of said first and second outputs thereof absent said constant polarity control signal appearing on said control converter output.

14. The apparatus of claim 13 wherein said relay is provided in a traffic signal light control system and said first periodic electrical energization source is selectively provided to said relay control input through a flash decision switch in said control system operated by remaining portions of said control system to select which of said first and second semiconductor switches is to have a conductive path provided between said first and second terminating regions thereof.

15. The apparatus of claim 13 wherein said relay is provided in a traffic signal light control system and said first periodic electrical energization source is selectively provided to a corresponding one of said first and second relay power inputs through a load switch in said control system operated by remaining portions of said control system to select when said first periodic electrical energization source is to be coupled thereto.

16. The apparatus of claim 13 wherein said relay is provided in a traffic signal light control system and said second periodic electrical energization source is selectively provided to a corresponding one of said first and second relay power inputs.

17. The apparatus of claim 13 wherein each of said first and second semiconductor switches comprises a triac having first and second main terminals serving as said first and second terminating regions thereof and a gate terminal with an optically activated bilateral switch coupled between said gate terminal and a corresponding one of said first and second main terminals, and with said control input being provided by a light-emitting diode optically coupled to said bilateral switch.

18. The apparatus of claim 13 further comprising third and fourth semiconductor switches each having first and second terminating regions and a control input by which said semiconductor switch is capable of being directed to provide a conductive path between said first and second terminating regions thereof, said third and fourth semiconductor switches first terminating regions each being electrically connected to a second relay power output suited for selective coupling to a corresponding one of said first and second periodical electrical energization sources, said third semiconductor switch second terminating region being electrically connected to a third relay power input and said fourth semiconductor switch second terminating region being electrically connected to a fourth relay power input, said third and fourth relay power inputs being suited for selective coupling to a corresponding one of said first and second periodical electrical energization sources, and further, a second pair of operation converters each having first and second outputs with said first output thereof being electrically connected to a corresponding one of said first and second supervisory switches first terminating regions, and having an input suited for electrical connection for selective coupling to a corresponding one of said first and second periodic electrical energization sources, said pair of operation converters each being capable of providing a constant polarity operational electrical energy between said first and second outputs thereof in response to being electrically energized from a corresponding one of said first and second periodic electrical energization sources, and with said switching coupler having a third pair of inputs electrically connected between a corresponding one of said first outputs of said second pair of operation converters and a corresponding one of said first and second supervisory switches second terminating regions, a fourth pair of inputs electrically connected between a corresponding one of said second outputs of said second pair of operation converters and a corresponding one of said first and second supervisory switches second terminating regions, and having third and fourth outputs each coupled to a corresponding one of said third and fourth semiconductor switches control inputs, said switching coupler also for providing a switching signal based at least in part on said constant polarity operational electrical energy provided between said first and second outputs of one of said second pair of operation converters to just one of said third and fourth outputs thereof in response to said constant polarity control signal appearing on said control converter output, and of providing such a said switching signal on just that remaining one of said third and fourth outputs thereof absent said constant polarity control signal appearing on said control converter output.

19. The apparatus of claim 13 wherein said relay is provided in a traffic signal light control system and said traffic signal light control system provides solely said first and second periodical electrical energization sources to said relay as electrical energization sources therefor.

20. The apparatus of claim 14 wherein said first and second periodical electrical energization sources differ in frequency.

21. The apparatus of claim 15 wherein said first and second periodical electrical energization sources differ in frequency.

22. The apparatus of claim 16 wherein said first and second periodical electrical energization sources differ in frequency.

23. The apparatus of claim 17 wherein said relay is provided in a traffic signal light control system and a signal light is coupled to said relay first power output.

24. The apparatus of claim 18 wherein each of said third and fourth semiconductor switches comprises a triac having first and second main terminals serving as said first and second terminating regions thereof and a gate terminal with an optically activated bilateral switch coupled between said gate terminal and a corresponding one of s aid first and second main terminals, and with said control input being provided by a light-emitting diode optically coupled to said bilateral switch, said relay being provided in a traffic signal light control system with a first signal light coupled to said relay first power output and with a second signal light coupled to said relay second power output.

* * * * *